United States Patent
Tailliet et al.

(10) Patent No.: US 11,380,377 B2
(45) Date of Patent: Jul. 5, 2022

(54) METHOD FOR WRITING DATA IN A MEMORY OF A CONTACTLESS TRANSPONDER, AND CORRESPONDING CONTACTLESS TRANSPONDER DEVICE

(71) Applicant: STMicroelectronics (Rousset) SAS, Rousset (FR)

(72) Inventors: Francois Tailliet, Fuveau (FR); Beatrice Brochier, Chateauneuf (FR); Sylvain Fidelis, Belcodene (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 17/188,569

(22) Filed: Mar. 1, 2021

(65) Prior Publication Data
US 2021/0280228 A1 Sep. 9, 2021

(30) Foreign Application Priority Data
Mar. 3, 2020 (FR) ...................................... 2002132

(51) Int. Cl.
*G11C 14/00* (2006.01)
*G11C 7/22* (2006.01)
*G11C 7/10* (2006.01)

(52) U.S. Cl.
CPC ............ *G11C 7/222* (2013.01); *G11C 7/1057* (2013.01); *G11C 7/1069* (2013.01); *G11C 7/1084* (2013.01); *G11C 7/1096* (2013.01)

(58) Field of Classification Search
CPC ...................................................... G11C 7/222

USPC .......................................... 365/185.08, 233.1
See application file for complete search history.

(56) References Cited

U.S. PATENT DOCUMENTS

| | | | |
|---|---|---|---|
| 2014/0085978 A1* | 3/2014 | Lee ..................... | G11C 11/005 365/185.08 |
| 2014/0369120 A1* | 12/2014 | Tailliet ................. | G11C 16/10 365/185.08 |
| 2021/0158859 A1* | 5/2021 | Gupta ................. | G11C 11/4094 |

FOREIGN PATENT DOCUMENTS

| FR | 3007186 A1 | 12/2014 |
|---|---|---|
| WO | 2007028872 A1 | 3/2007 |
| WO | 2013079885 A1 | 6/2013 |

OTHER PUBLICATIONS

INPI Search Report and Written Opinion for FR Appl. No. 2002132 dated Nov. 12, 2020 (8 pages).

* cited by examiner

*Primary Examiner* — Hoai V Ho
(74) *Attorney, Agent, or Firm* — Crowe & Dunlevy

(57) ABSTRACT

A contactless transponder includes a non-volatile static random access memory including memory points. Each memory point is formed by a volatile memory cell and a non-volatile memory cell. A protocol processing circuit receives data and stores the received data in the volatile memory cells of the memory. A write processing circuit is configured, at the end of the reception and storage of the data, to record, in a single write cycle, the data from the volatile memory cells to the non-volatile memory cells of the respective memory points.

8 Claims, 4 Drawing Sheets

METHOD FOR WRITING DATA IN A MEMORY OF A CONTACTLESS TRANSPONDER, AND CORRESPONDING CONTACTLESS TRANSPONDER DEVICE

PRIORITY CLAIM

This application claims the priority benefit of French Application for Patent No. 2002132, filed on Mar. 3, 2020, the content of which is hereby incorporated by reference in its entirety to the maximum extent allowable by law.

TECHNICAL FIELD

Methods for using and implementing the embodiments herein relate to contactless transponders having a memory, and the writing of data in a memory of a contactless transponder.

BACKGROUND

The embodiments apply particularly to contactless transponders, in particular NFC (near field communication) or RFID (radio-frequency identification) transponders, for example labels or cards, usually designated by the term tags.

Radio-frequency identification, better known to persons skilled in the art by the term RFID, is a generic term that designates overall contactless communications allowing identification of an apparatus on radio frequencies.

Near field communication, better known to persons skilled in the art by the term NFC, is a wireless connectivity technology that allows communication over a short distance, for example 10 cm, between electronic devices (transponders), such as, for example, contactless chip cards or tags, and readers. In the case of tags communicating with high-power RFID readers, the communication distance may exceed 1 meter.

A contactless transponder is a transponder capable of exchanging information via an antenna with a contactless reader, in accordance with a contactless communication protocol, for example a protocol compatible with NFC technology.

NFC technology is an open technology platform standardized in ISO/IEC 18092 and ISO/IEC 21481 and incorporates numerous already existing standards such as, for example, ISO 14443 or ISO 15693 used in communication protocols.

During a transmission of information between a reader and a transponder, the reader generates a magnetic field by means of its antenna that is generally, in the standards conventionally used, a sinusoidal wave (the carrier) at 13.56 MHz.

In order to transmit information from the reader to the transponder, the reader uses an amplitude modulation of said carrier. The frequency of this modulation corresponds to a subcarrier of said carrier, and the frequency of this subcarrier depends on the communication protocol used.

For example, the frequency of the subcarrier may allow a data rate at 106 kb/s in ISO 14443, and at 26 kb/s in ISO 15693.

As for the transponder, it includes a processing circuit configured to demodulate the carrier received in order to obtain the data transmitted from the reader.

A passive transponder generally has no power supply and uses the wave coming from the reader in order to supply its integrated circuit, unlike an active transponder which is generally provided with its own power supply source such as a battery.

The integrated circuit of the transponder, passive or active, may include a non-volatile memory for recording the data transmitted from the reader, typically an electrically erasable programmable read only memory (EEPROM).

This is, in particular, the case with transponders intended to serve as a gateway between an external contactless communication apparatus, for example a multifunction mobile telephone, better known by the term smartphone, and a microcontroller of a connected system, for example a connected object such as a connected watch, or connected home automation equipment, without these examples being limitative.

Such transponders serving as a gateway may also be termed "dynamic transponders" since the data stored in the memory thereof may vary over time either because of the external contactless communication apparatus or because of the microcontroller, via a cable connection.

Conventionally, writing data in the non-volatile memories of contactless transponders, by contactless communication, is lengthy and relatively risky.

In this regard reference is made to FIGS. 1 and 2.

FIGS. 1 and 2 depict a contactless transaction between a reader, such as a multifunction mobile telephone, and a transponder, such as an NFC card. The transaction comprises a contactless transmission of data RD to the transponder by the reader and a non-volatile writing WD of the data RD received by the transponder.

In the case of FIG. 1, the data RD received by the transponder are directly entered in write-protect plugs of the EEPROM memory, and the size of each burst of data RD is limited by the maximum size that can enter the write-protect plugs, that is to say typically one memory page, typically comprising 4 to 16 bytes.

The maximum size of data RD of each burst is thus limited by the size of the memory page (typically 4 to 16 bytes), and the transaction comprises a sequence of reception phase pairs RD of a page—writing cycle WD of the page, until the end of the transaction Tf0.

In the case of FIG. 2, the data RD received by the transponder are first of all stored in a volatile buffer memory, and the size of the bursts of data RD is limited by the size of the buffer memory, easily larger than a memory page of 14 to 16 bytes.

That being the case, writing in the EEPROM memory remains limited by the size of one page per cycle, and write cycles WD each of one page are successively implemented after the reception of all the data RD.

In both cases, the writing in the EEPROM memory is of the same duration and may take hundreds of milliseconds for several kilobits of data. A duration of a few hundreds of milliseconds is not transparent for a user, who has to hold the transponder, for example a card, or hold the reader, for example a multifunction mobile telephone, throughout the duration of the transaction.

Consequently, since the duration Tf0-Ti0 of a transaction is long, the risk of corruption and loss of data in the case of pulling away, that is to say removal out of the range of the communication of one of the contactless appliances during the transaction, is probable and problematic.

Furthermore, the power P2 used by the writing WD, which is greater than the power P1 used by the reception RD, limits the range in which the transponder must be held with respect to the reader. The greater the power expended at an instant of the transaction, the shorter the range.

Thus, there is a need to write data in the memory of a contactless transponder, passive or active, in large quantities and reliably, in particular vis-à-vis potential pullings away.

SUMMARY

According to one aspect, a method for writing data in a memory of a contactless transponder is proposed, the memory being a non-volatile static random access memory including memory points each comprising a volatile memory cell and a non-volatile memory cell, the method comprising a protocol phase comprising receiving data, and a storage of the received data in the volatile memory cells of the memory, and, at the end of the protocol phase, a write phase comprising a single write cycle for recording the data from the volatile memory cells to the non-volatile memory cells of the respective memory points.

In other words, it is proposed, according to this aspect, to use the volatile memory cells of the non-volatile static random access memory as a buffer memory.

Each volatile memory cell is moreover combined, bit by bit in each memory point, with a non-volatile memory cell of the EEPROM type.

For example, a non-volatile memory cell is of the EEPROM type in that it includes an access transistor and a floating-gate state transistor coupled in series.

Thus firstly there is no difference between the size of the "volatile memory" and the size of the "non-volatile memory" since these memories make up a single non-volatile static random access memory element.

This advantageously makes it possible to receive a large quantity of data, for example with a size which may equal the whole of the size of the memory, without interrupting the transmission of the data during the protocol phase.

Moreover, each volatile memory cell of the non-volatile static random access memory has a function, during the write phase, comparable to the function of the write-protect plugs used in the conventional EEPROM memory techniques (the size of which is conventionally limited to one page).

However, the size of the data able to be written in a single write cycle according to this aspect is not limited to one page of the memory, and all the data stored in the volatile memory cells (and therefore optionally the whole of the memory) can be transferred into the non-volatile memory cells in a single common write cycle, during the write phase.

And, according to one embodiment, the write cycle of the write phase is of constant duration, whatever the size of the data received during the protocol phase.

A single write cycle is therefore necessary for writing data that may have a size of between the smallest unit accessible in writing in the memory and up to the whole of the size of the memory, optionally of constant duration. The smallest unit accessible in writing, otherwise referred to as the granularity of the memory, is one byte (8 bits) for example, while the memory may have a total size of 4 kilobits (4096 bits) for example distributed over pages of 4 bytes each for example.

Thus, the duration of the write phase is always very short. For example, the write phase has a duration of around 5 ms (milliseconds).

Consequently the risk of an interruption of the contactless communication, for example because of pulling away, is extremely improbable during such a duration (5 ms) and the risk of corruption of the data is low, even during writing of a large quantity of data.

Furthermore, the duration of the write phase being short, the energy consumption of the write phase is also small, and this can make it possible to increase the range of the contactless communication.

It will be noted that the advantages mentioned above diverge from the conventional applications of non-volatile static random access memories (NVSRAMs), that is to say typically high-end applications such as servers processing sensitive data, vehicle black boxes or medical devices, which typically provide for the use of NVSRAM for purposes of secure recording of data in the event of serious unforeseen events or accidents, while benefiting from infinite endurance under normal conditions.

NVSRAM memories are conventionally more expensive than EEPROM memories, and are in fact rarely used for their capacity with regard to size of data that can be written in one cycle.

In this regard, reference can be made to United States Patent Application Publication No. 2020/0035293 A1, as well as to the French patent application filed on 27 Jan. 2020 under the filing number 2000761, incorporated herein by reference, which describe architectures of economical non-volatile static random access memories that make it possible in particular to program data at any number of independent addresses in a single write cycle, without being limited by data on a single page. These architectures may advantageously incorporate the memory according to the aspects defined here.

This being the case, other conventional non-volatile static random access memories NVSRAM typically provide for a process of reloading at start-up, during which the prior data recorded in the non-volatile memory cells are loaded into the respective volatile memory cells. This takes time and consumes energy, and is generally inappropriate for transponders benefiting from limited energy and little time at start-up for providing this process.

Thus, according to an advantageous embodiment, only the data received during the protocol phase are stored in the volatile memory cells of the corresponding memory points, and data previously recorded in the non-volatile memory cells of other memory points are not reloaded into the volatile memory cells of said other memory points.

United States Patent Application Publication No. 2020/0035303 A1, and the French patent application filed on 27 Jan. 2020 under the filing number 2000761, incorporated by reference, describe non-volatile static random access memory architectures without global reloading of the data on start-up. These architectures can advantageously incorporate the memory according to the aspects defined here, and according to the embodiment described above.

According to one embodiment, the method further comprises, during the protocol phase, a storage of energy by a capacitive circuit in sufficient quantity to supply the write phase with energy autonomously, and, during the write phase, a supply of the memory with the energy stored by the capacitive circuit.

This embodiment is particularly advantageous if the transponder is of the passive type, that is to say if the transponder used is the energy of the wave coming from a reader to supply its functioning.

Thus, even if the transponder is completely removed from the range of the contactless communication, and is thus deprived of energy, the write phase can end autonomously with the energy stored by the capacitive circuit. This makes it possible to rigorously dispel the risk of corruption of the data in the event of pulling away during the write phase.

Furthermore, storing the energy during the protocol phase period makes it possible to distribute the energy consumption more equitably over the period of a transaction, compared with low consumption during the protocol phase and high consumption during the write phase. This can make it possible to increase the range of the contactless communication.

According to one embodiment, the single write cycle comprises a generation of writing stimuli in all the memory points of the memory plane, the writing stimuli being suitable for causing the recording of said data in the non-volatile memory cells automatically, determined by the data respectively stored in the volatile memory cells of the respective memory points.

This embodiment makes it possible to write directly in the non-volatile memory cells the data contained in the volatile memory cells, without generating the writing stimuli in a dedicated fashion for each memory point according to the data stored. The patent applications cited above describe examples of architectures of non-volatile static random access memories compatible with this embodiment.

According to another aspect, a contactless transponder device is proposed, including a non-volatile static random access memory including memory points each comprising a volatile memory cell and a non-volatile memory cell, a protocol processing circuit configured to receive data, and to store received data in the volatile memory cells of the memory, as well as a write processing circuit configured, at the end of the reception and storage of the data, to record in a single write cycle the received data stored in the volatile memory cells, in the non-volatile memory cells of the respective memory points.

According to one embodiment, the write processing circuit is configured so that said write cycle is of constant duration, whatever the size of the data received by the protocol processing circuit.

According to one embodiment, the device further comprises a capacitive circuit configured to store energy, during the reception and storage of the data by the protocol storage means, in sufficient quantity to autonomously supply energy to the write processing circuit during said write cycle, and to supply the write processing circuit during said recording, in particular during the single write cycle.

According to one embodiment, the protocol processing circuit is configured to store only the data received in the volatile memory cells of the corresponding memory points, and the memory is configured to not reload data previously recorded in the non-volatile memory cells of other memory points, in the volatile memory cells of said other memory points.

According to one embodiment, the write processing circuit is configured, during said write cycle, to generate writing stimuli in all the memory points of the memory, the writing stimuli being suitable for causing the recording of said data in the non-volatile memories in a way that is automatically determined by the data respectively stored in the volatile memory cells of the respective memory points.

BRIEF DESCRIPTION OF DRAWINGS

Other advantages and features of the invention will emerge from an examination of the detailed description of embodiments and implementations, which are in no way limitative, and of the accompanying drawings, on which.

DETAILED DESCRIPTION

Figure 3:
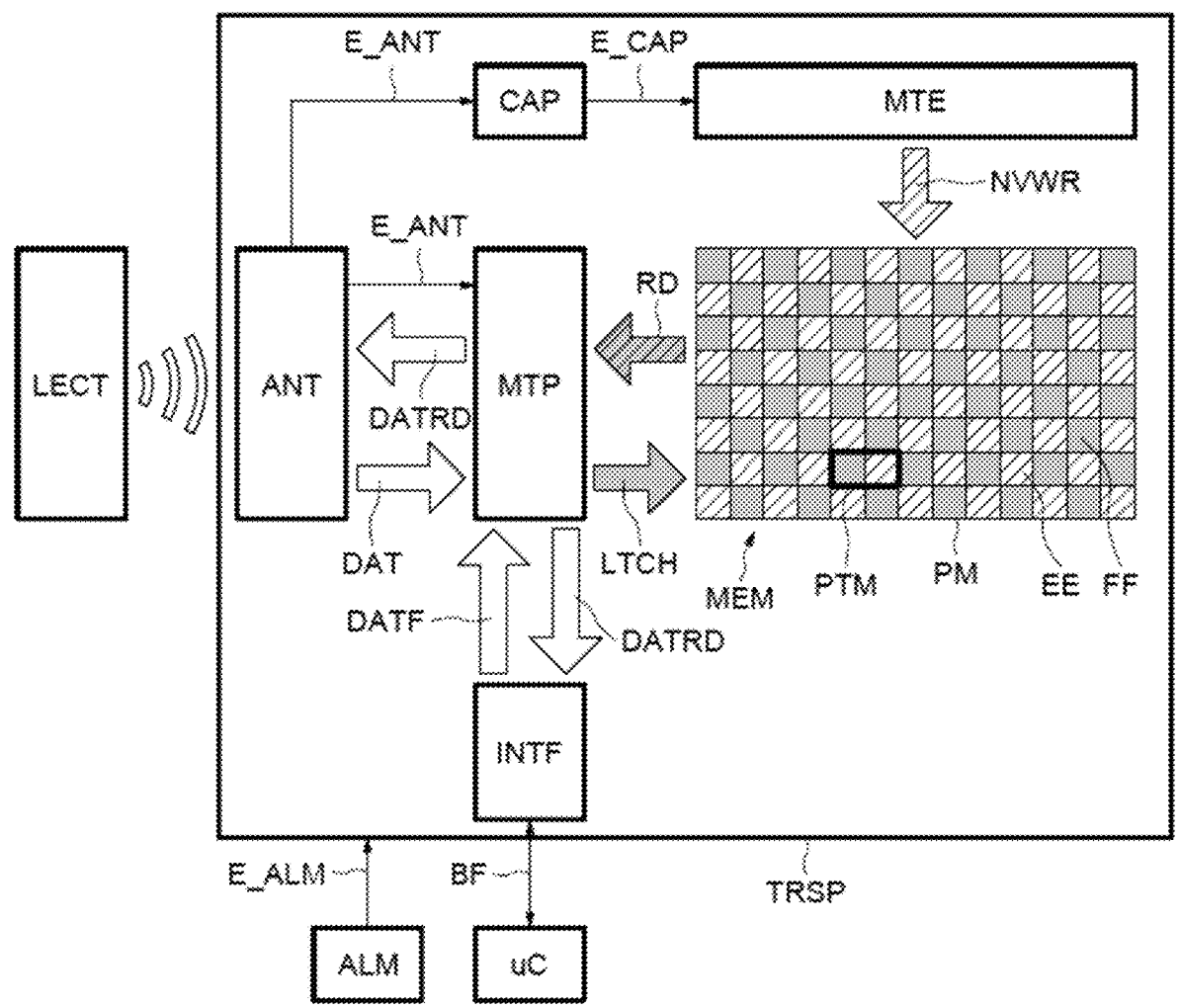
FIG. 3 is a block diagram of a transponder device.

FIG. 3 depicts a transponder device TRSP of the contactless type, and/or optionally of the dynamic transponder type, intended to serve as a gateway between an external apparatus and a microcontroller, typically of a connected object.

The transponder TRSP is capable of exchanging information via an antenna ANT with a contactless reader LECT, according to a contactless communication protocol, for example compatible with NFC technology.

NFC technology is an open technological platform standardized in ISO/IEC 18092 and ISO/IEC 21481 and incorporates numerous already existing standards such as for example ISO 14443 or ISO 15693 used in communication protocols.

During a transmission of information between the reader LECT and the transponder TRSP, the reader LECT generates a magnetic field by means of its antenna (not shown), which is typically a 13.56 MHz sinusoidal carrier wave. The information is communicated by an amplitude modulation of said carrier.

The transponder TRSP includes protocol processing circuit MTP configured to demodulate the carrier received in order to obtain the data transmitted from the reader LECT.

In a first case, the transponder TRSP may be of the passive type, such as a tag or a card, and has no power supply. In which case the transponder TRSP uses the electromagnetic energy E_ANT of the wave coming from the reader LECT, transferred onto its antenna ANT, in order to supply the functioning thereof.

In a second case, the transponder TRSP may be of the active type and is provided with its own power source ALM, such as a battery. In which case the transponder TRSP uses the energy E_ALM from the power source ALM to supply the functioning thereof.

Finally, in a third case, the transponder TRSP may be capable of functioning both in a passive mode and in an active mode, such as a dynamic transponder belonging to a connected object configured, for example, to communicate in active mode when the connected object is activated, or in passive mode when the connected object is deactivated.

For a transmission of information from the transponder TRSP to the reader LECT, the reader LECT generates the magnetic field (the carrier) without modulation. In passive mode and in active mode, the transponder TRSP is capable of retro-modulating the field generated by the reader LECT, according to the information to be transmitted, in a conventional manner for example by modifying the load connected to the terminals of the antenna ANT. For example, the protocol processing circuit MTP is configured to control the retro-modulation on the antenna ANT.

During the exchange between the transponder TRSP and the contactless reader LECT, the data are encapsulated in frames having a format defined according to the type of protocol used. The protocol processing circuit MTP of the transponder TRSP is, in particular, configured to de-encapsulate the data DAT that have just been recorded in the memory MEM.

In a case where the transponder TRSP is a dynamic transponder, that is to say a transponder intended to serve as a gateway between the external reader LECT and a microcontroller uC, for example the microcontroller of a connected object, the transponder TRSP further includes a cable interface INTF connected to the microcontroller uC. Data DATF to be written in the memory MEM can thus be transmitted by the microcontroller uC via an incoming cable bus BF on the cable interface INTF.

The protocol processing circuit MTP of the transponder TRSP is then also configured in order to process, according to the type of protocol used on the cable bus BF, the data DATF that have just been recorded in the memory MEM.

The memory MEM of the transponder TRSP is a non-volatile static random access memory of the NVSRAM type (standing for non-volatile static random access memory) and includes memory points PTM each comprising a volatile memory cell FF and a non-volatile memory cell EE.

The memory points PTM are organized in a matrix in a memory plane PM.

The volatile memory cells FF include, for example, a bistable lock composed of two switches, the outputs of which each loop back onto the input of the other switch.

The non-volatile memory cells EE advantageously include a EEPROM cell, that is to say a floating gate state transistor in series with an access transistor. For example, the conduction terminal of the access transistor that is not coupled with the state transistor is coupled to an output of the bistable lock of the memory point, and to a bit line.

Consequently, the protocol processing circuit MTP is capable of receiving data DAT that may have a size between the smallest unit accessible in writing in the memory, that is to say typically 1 byte of 8 bits, and the whole of the size of the memory, for example 4 kilobits (4096 bits).

This is because the protocol processing circuit MTP is configured to store LTCH the received data DAT immediately or almost immediately (that is to say just after having demodulated and de-encapsulated the received signal) in the volatile memory cells FF of the memory MEM.

Thus, even if the storage LTCH in the volatile memory cells FF of the memory plane PM is limited by the size of a page, the protocol processing circuit MTP stores the data DAT on the fly during receptions of the protocol phase in the volatile memory cells FF (see below in relation to FIG. 4).

Naturally the protocol processing circuit MTP is configured to store LTCH the data DATF received via the cable bus interface INTF in the same way in the volatile memory cells FF of the memory MEM.

Moreover, the protocol processing circuit MTP may include a reading circuit configured to read RD the data of the memory MEM, and to transmit the read data DATRD either without contact via the antenna ANT or on the cable bus BF via the cable interface INTF. The protocol processing circuit MTP is configured in this regard so as to format, or encapsulate, the read data DATRD according to the type of contactless protocol or cable protocol used.

Furthermore, the protocol processing circuit MTP is advantageously configured to store LTCH only the received data DAT, DATF in the volatile memory cells FF.

This is because the memory MEM is advantageously configured to not reload the data previously recorded in the non-volatile memory cells EE to the volatile memory cells FF of the respective memory points, unlike the conventional non-volatile static random access memory architectures NVSRAM.

For example, United States Patent Application Publication No. 2020/0035303 A1 and the French patent application filed on 27 Jan. 2020 under the filing number 2000761, incorporated by reference, describe non-volatile static random access memory architectures without global reloading of the data on start-up.

This makes it possible firstly not to require a process of reloading the data when the transponder TRSP is started up, and thus to limit the energy consumption not only at start-up but also during the functioning since it is not necessary to routinely keep the data stored in all the volatile memory cells FF.

Thus, during a reading RD of data DATRD, the read circuit is capable of accessing both the volatile memory cells FF and the non-volatile memory cells EE in order to read data of the memory MEM.

The received data to be written in the memory will now be designated by the reference "DAT", irrespective of whether they come from the contactless reader LECT or from the cable microcontroller uC.

At the end of the reception and storage LTCH of the data DAT in the volatile memory cells FF, write processing circuit MTE records the data DAT in the non-volatile memory cells EE.

The write processing circuit MTE is configured to record, in a single write cycle NVWR, the received data DAT stored in the volatile memory cells FF, in the non-volatile memory cells EE of the respective memory points.

For example, the write processing circuit MTE is configured in this regard to generate writing stimuli in all memory points PTM of the memory, or at least in all the memory points PTM that store a data item in the volatile memory cell FF.

The writing stimuli are advantageously suitable for causing the recording of the data in the non-volatile memory cells EE in a way that is automatically determined by the data respectively stored in the volatile memory cells FF of the respective memory points.

The writing stimuli are thus suitable for programming data at any number of independent addresses in a single write cycle NVWR, without being limited by data on a single page.

The recording of the data in the non-volatile memory cells is done by injection of a charge in the floating gate of the state transistors, for example by Fowler-Nordheim effect or by a phenomenon of injection of hot carriers, or other charge injection mechanisms, typically obtained by applying high-voltage stimuli, for example of around 10 to 15 volts, in the volatile memory cells.

The write processing circuit MTE advantageously includes a high-voltage generating circuit, such as a charge pump circuit, for generating the writing stimuli in the memory plane PM.

Furthermore, the write cycles NVWR are of a constant duration, whatever the size of the data DAT received by the protocol processing circuit MTP.

A memory architecture providing such writing stimuli is in particular described in United States Patent Application Publication No. 2020/0035293 A1, as well as in the French patent application filed on 27 Jan. 2020 under the fling number 2000761, incorporated by reference.

Consequently, the total time of the contactless transaction is greatly reduced (see below in relation to FIG. 4), which makes the contactless communication more secure and more robust in the face of pulling away during a use by a human, and moreover increases the bit rate of a production chain providing a loading of data into the memory MEM.

Furthermore, in the example in FIG. 3, a capacitive circuit CAP is advantageously provided for supplying energy E_CAP autonomously to the write processing circuit MTE during the recording of the data in the non-volatile memory cells EE.

For example, the capacitive circuit CAP comprises a circuit including a capacitor for storing energy, optionally a charge pump for increasing the level of the voltage charged in the capacitor, and optionally a conventional logic device for switching between a charging mode in which the capacitor stores the energy E_ANT transferred onto the antenna ANT, and a supply mode in which the capacitor supplies the stored energy E_CAP to the memory MEM.

Thus, if the capacitive circuit CAP is correctly charged at the end of the protocol phase, then the write cycle NVWR cannot fail, once it has begun.

The capacitive circuit CAP can be configured to store energy E_ANT in a sufficient quantity during the protocol phase, that is to say the phase of receiving and storing LTCH data DAT by the protocol processing circuit MTP.

This is because, if the size of the data transmitted during the protocol phase is large, the time for charging the capacitive circuit CAP will be all the longer, making it possible to have low charging currents and a limited impact on consumption during the reception of the data.

The presence of the capacitive element CAP is particularly advantageous if the transponder TRSP is configured to use the energy E_ANT collected on the antenna ANT for supplying its functioning, that is to say in the case of the transponder TRSP being of the passive type, or is capable of functioning in a passive mode.

In the case of the transponder TRSP always being in passive mode, the block ALM illustrated in FIG. 3 is not present.

In the case of the transponder TRSP always being in active mode, that is to say provided with a power supply ALM supplying the energy E_ALM for powering its functioning, the capacitive element is not necessary for supplying the write processing circuit MTE autonomously during the write cycle NVWR.

Nevertheless, charging the capacitive element CAP with the element E_ALM provided by the supply ALM during the protocol phase (not depicted) in order to supply the write processing circuit MTE during the write cycle NVWR, can make it possible to distribute the energy consumption and to avoid a consumption peak on the supply ALM at the time of the write phase NVWR.

Figure 4:
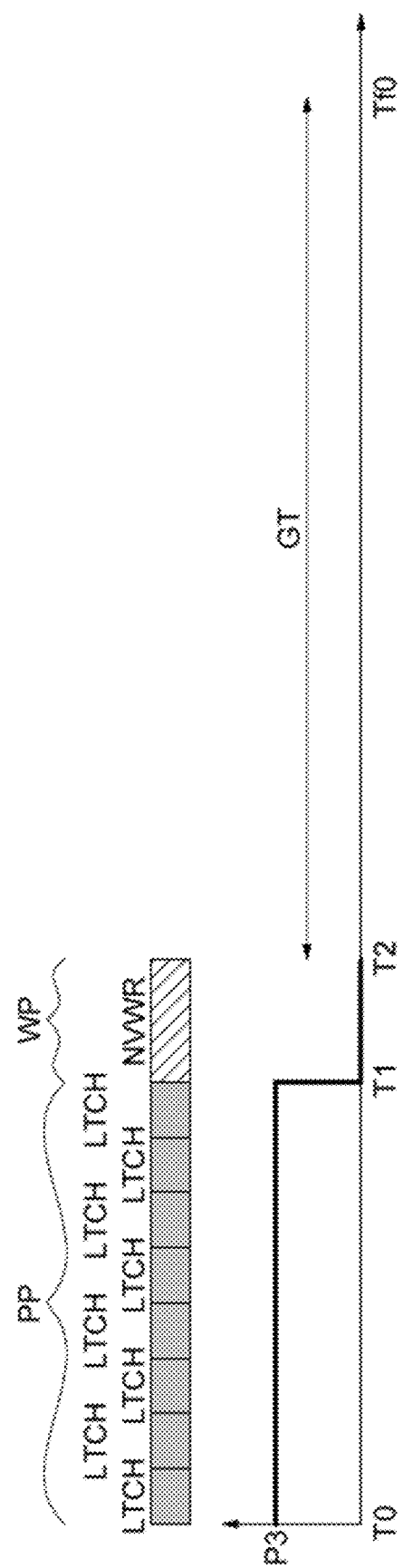
FIG. 4 shows a contactless transaction.

FIG. 4 depicts an example of a contactless transaction between a reader, such as a multifunction mobile telephone, and a contactless transponder TRSP as described above in relation to FIG. 3.

In this example, the transaction is done from the reader to the transponder TRSP, in order to implement the method for writing data DAT in the memory MEM of the transponder TRST.

The method comprises a protocol phase PP comprising a reception of data that may have a size between the smallest unit accessible in writing in the memory and the whole of the size of the memory, and an immediate or almost immediate storage LTCH of the data received in the volatile memory cells of the memory.

For example, at each reception of data making the size of a page of the memory MEM, the protocol processing circuit MTP stores on the fly LTCH the data page received DAT in the volatile memory cells FF, and continue to receive the data of the following page in parallel.

At the end of the protocol phase PP, a write phase WP is implemented. The write phase WP comprises a single write cycle NVWR recording the data received and stored in the volatile memory cells, in the non-volatile memory cells of the respective memory points.

Thus data that may have a size between the smallest unit accessible in writing in the memory and the whole of the size of the memory are written in the non-volatile memory cells in a single write cycle NVWR, for example 5 ms (milliseconds).

This produces a considerable saving in time compared with the conventional techniques, which add together write cycles of 5 ms per page.

The total duration of the write method according to the example in FIG. 4 (in relation to FIG. 3) will now be compared with the duration of the conventional write methods, as described previously in relation to FIG. 2, in an example of application of writings of 4 kbits (4 kilobits, i.e. 4096 bits) in a memory the pages of which make 4 bytes, according to two types of communication protocol compatible with NFC technology.

For example, the first protocol in question is the protocol defined in ISO 14443, with which there is typically associated a contactless communication rate of 106 kbits/s (kilobits per second); while the second protocol in question is defined in ISO 15693, with which there is typically associated a contactless communication rate of 26 kbits/s (kilobits per second). Hereinafter, the communication protocols defined in the respective standards will be designated "ISO 14443 protocol" and "ISO 15693 protocol".

Thus, in the write method illustrated by FIG. 4, the duration T1-T0 of the protocol phase PP is 40 ms for 4096 bits at 106 kb/s in the ISO 14443 protocol; or 158 ms for 4096 bits at 26 kb/s in the ISO 15693 protocol.

The duration T2-T1 of the write phase WP is always 5 ms in both technologies. The total duration T2-T0 of the method is therefore 45 ms in the ISO 14443 protocol, and 163 ms in the ISO 15693 protocol.

Figure 2:
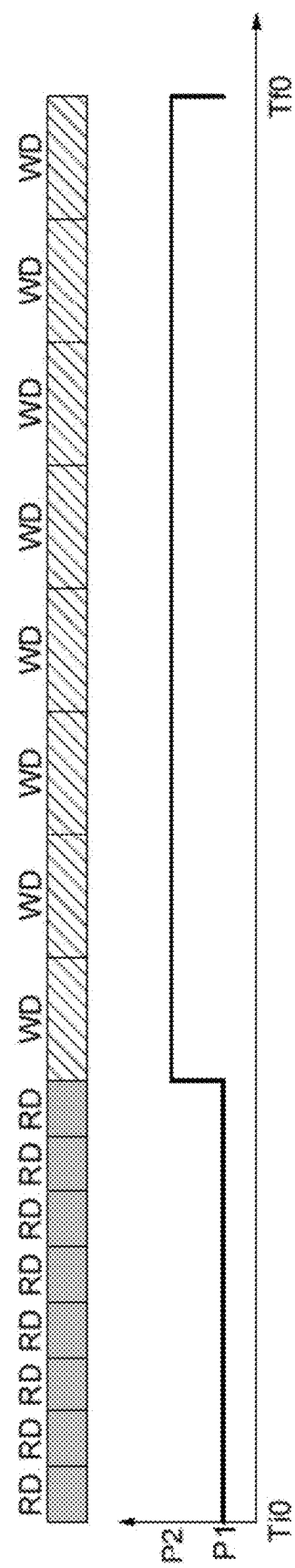

In comparison, in the conventional write method illustrated by FIG. 2, the duration of the receptions of the data RD is also 40 ms for 4096 bits at 106 kb/s in the ISO 14443 protocol; or also 158 ms for 4096 bits at 26 kb/s in the ISO 15693 protocol. As for the duration of the writings WD, this is defined by the number of write cycles of a 4 byte page, each of 5 ms, in the two technologies.

This represents 128 write cycles of 5 ms, i.e. 640 ms for writing the 4 kbits in the non-volatile memory of the EEPROM type.

The total duration Tf0-Ti0 of the conventional method is therefore 680 ms in the ISO 14443 protocol, and 798 ms in the ISO 15693 protocol.

In other words, the saving in time GT (T2-Tf0) obtained by the method illustrated by FIG. 4 corresponds to a write method substantially 15 times quicker in ISO 14443 protocol, and substantially 5 times quicker in ISO 15693 protocol, than the conventional transactions.

From the point of view of the consumption of energy, it is considered that the electrical consumption of a cycle of writing a 4 byte page in a conventional EEPROM memory is typically 25 µA (microamperes).

Figure 1:
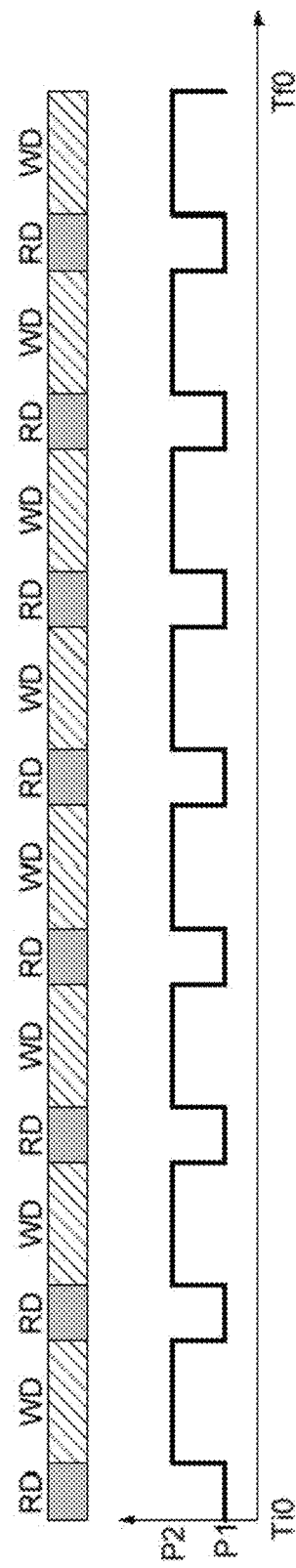
FIGS. 1 and 2 illustrate conventional contactless transactions.

The power provided for such a conventional write cycle WD is denoted P2 (FIGS. 1 and 2).

The non-volatile static random access memory MEM described above in relation to FIG. 3 has a consumption of for example 200 µA for the single write cycle NVWR.

The case is considered where the memory MEM includes the capacitive circuit CAP as described previously in relation to FIG. 3, which is charged during the protocol phase PP. The protocol phase PP lasts for 40 ms in the ISO 14443 protocol, or 158 ms in the ISO 15693 protocol.

The power supplied during the protocol phase PP, for storing the energy by the capacitive circuit CAP in sufficient quantity to supply the write phase WP autonomously, is denoted P3.

A drop in voltage of 4.5V (volts) at the end of a write cycle NVWR for a capacitor initially charged to 6V at the start of the write cycle NVWR is tolerated.

The capacitive value of the capacitor is parameterized accordingly at 220 nF (nanofarads) minimum.

Thus, in the case of the ISO 14443 protocol, to charge a 220 nF capacitor to 6V in 40 ms (PP) with a charge pump with a mean efficiency estimated at 50% (pessimistic estimation), a mean charging current of 66 µA is consumed during the protocol phase PP.

This results in a power P3 higher than the power P2, in the ISO 14443 protocol. In the case of the ISO 15693 protocol, to charge a 220 nF capacitor to 6V in 158 ms (PP) with a charge pump with a mean efficiency estimated at 50% (pessimistic estimation), a mean charging current of 16.7 µA is consumed during the protocol phase PP.

This results in a power P3 lower than the power P2, in the ISO 15693 protocol. Consequently, the device and method described in relation to FIGS. 3 and 4 consume less power than the conventional transactions in the ISO 15693 protocol and thus make it possible to increase the range of the contactless communication. This is particularly advantageous since a long range is a main asset of the ISO 15693 protocol.

On the other hand, the range of the contactless communication in the ISO 14443 protocol may be reduced. This is not a problem since the range is not a major asset in the ISO 14443 protocol. The ISO 144443 protocol is mainly advantageous for the speed of communication, however the device and method described in relation to FIGS. 3 and 4 makes it possible to accelerate the transaction by a factor of 15 (see application above).

In summary, the contactless transponder device TRSP described above includes a non-volatile static random access memory in place of a conventional non-volatile memory of the EEPROM type, not to benefit from the original advantage of the NVSRAMs with unlimited endurance for a non-volatile memory, but to exploit the particularity of the functioning of the non-volatile writing specific to non-volatile static random access memories which means that the size of the data written in a write cycle is not limited to one page (in particular the non-volatile static random access memories described in United States Patent Application Publication Nos. 2020/0035293 A1 and US 2020/0035303 A1, and/or also in the French patent application filed on 27 Jan. 2020 under the filing number 2000761.

This makes it possible to program large quantities of data in a single write cycle, which reduces the time for the transactions of the ISO 14443 and ISO 15693 protocols, and thereby improves resistance to the alteration of data.

Providing the capacitive circuit CAP makes it possible to compensate for the relatively high consumption of the single write cycle, and furthermore to be even more resistant in the face of alteration of data, and the possibility of a longer contactless communication range.

Thus, overall, the writing rate is faster, the write operations are more secure, and the range may be greater.

Moreover, many cases of use can benefit from the more secure and faster writing process, in particular for a large quantity of data, such as for example a personalized programming at the end of a contactless transponder production line, firmware updates, etc.

The invention claimed is:

1. A method for writing data in a memory of a contactless transponder operating in a passive mode, the memory being a non-volatile static random access memory including memory points, wherein each memory point comprises a volatile memory cell and a non-volatile memory cell, the method comprising:

generating power in said passive mode from electromagnetic energy received by said contactless transponder from a reader;

a protocol phase comprising:
  receiving data;
  storing the received data in the volatile memory cells of the memory; and
  storing the electromagnetic energy in a capacitive circuit; and at the end of the protocol phase, a write phase comprising:
  performing a single write cycle to record the data from the volatile memory cells to the non-volatile memory cells of the respective memory points; and
  in response to said contactless transponder being deprived of said electromagnetic energy from the reader, supplying power from the capacitive circuit to the memory that is sufficient to supply power for autonomously performing said single write cycle during the write phase.

2. The method according to claim 1, wherein said single write cycle of the write phase has a constant duration no matter the size of the data received during the protocol phase.

3. The method according to claim 1, wherein performing the single write cycle comprises storing only the data received during the protocol phase in the volatile memory cells of the corresponding memory points, and wherein data previously stored in the non-volatile memory cells of other memory points are not reloaded in the volatile memory cells of said other memory points.

4. The method according to claim 1, wherein performing the single write cycle comprises generating writing stimuli in all the memory points of the memory, the writing stimuli causing the recording of said data in the non-volatile memory cells in a way that is automatically determined by the data respectively stored in the volatile memory cells of the respective memory points.

5. A contactless transponder device operating in a passive mode to generate power from electromagnetic energy received by said contactless transponder from a reader, comprising:

a non-volatile static random access memory including memory points, wherein each memory point comprises a volatile memory cell and a non-volatile memory cell;

a protocol processing circuit coupled to the non-volatile static random access memory and configured to receive data and to store the received data in the volatile memory cells;

a capacitive circuit configured to store said electromagnetic energy during the reception and storage of the data by the protocol processing circuit; and a write processing circuit coupled to the capacitive circuit and the non-volatile static random access memory and configured, at the end of reception and storage of the data, to record, in a single write cycle, the data from the volatile memory cells to the non-volatile memory cells of the respective memory points;

wherein said write processing circuit responds to said contactless transponder being deprived of said electromagnetic energy from the reader by using power supplied from the capacitive circuit to the memory that is sufficient to autonomously perform said single write cycle during the write phase.

6. The device according to claim 5, wherein the write processing circuit is configured so that said write cycle has a constant duration no matter the size of the data received by the protocol processing circuit.

7. The device according to claim 5, wherein the protocol processing circuit is configured to store only the data received in the volatile memory cells of the corresponding memory points, and the memory is configured not to reload data previously recorded in the non-volatile memory cells of other memory points, in the volatile memory cells of said other memory points.

8. The device according to claim 5, wherein the write processing circuit is configured, during said write cycle, to generate writing stimuli in all the memory points of the memory, the writing stimuli suited to cause the recording of said data in the non-volatile memory cells in a way that is automatically determined by the data respectively stored in the volatile memory cells of the respective memory points.

\* \* \* \* \*